US006977817B2

(12) United States Patent
Suckow et al.

(10) Patent No.: US 6,977,817 B2
(45) Date of Patent: Dec. 20, 2005

(54) MODULAR CONTROLLER FOR A HOT MELT ADHESIVE DISPENSING SYSTEM

(75) Inventors: Daniel J. Suckow, Alpharetta, GA (US); Scott Means, Lawrenceville, GA (US); Sean Forney, Suwanee, GA (US); Duane Fisher, Cumming, GA (US)

(73) Assignee: Nordson Corporation, Westlake, OH (US)

( * ) Notice: Subject to any disclaimer, the term of this patent is extended or adjusted under 35 U.S.C. 154(b) by 373 days.

(21) Appl. No.: 10/252,617

(22) Filed: Sep. 23, 2002

(65) Prior Publication Data

US 2004/0055739 A1 Mar. 25, 2004

(51) Int. Cl.[7] .................................................. H05K 7/20
(52) U.S. Cl. ...................... 361/715; 361/752; 361/797; 361/834
(58) Field of Search ................................ 361/715, 797, 361/800, 752, 704, 687, 734; 222/1; 221/147

(56) References Cited

U.S. PATENT DOCUMENTS

| | | | | |
|---|---|---|---|---|
| 4,479,198 | A * | 10/1984 | Romano et al. | 361/687 |
| 6,315,161 | B1 * | 11/2001 | Bezaire et al. | 222/1 |
| 6,434,005 | B1 * | 8/2002 | Vinciarelli et al. | 361/704 |
| 2002/0181213 | A1 * | 12/2002 | Momiyama et al. | 361/756 |

OTHER PUBLICATIONS

Nordson Corporation, *Series 3500 Applicators*, Brochure, 2 pgs., 1994, 1996.

* cited by examiner

*Primary Examiner*—Kamand Cuneo
*Assistant Examiner*—Hung S. Bui
(74) *Attorney, Agent, or Firm*—Wood, Herron & Evans, L.L.P.

(57) ABSTRACT

A controller for a hot melt adhesive dispensing system has a main circuit board and power modules which are removably received on a controller enclosure. The power modules are directly couplable with the main board and with cord sets from heated hoses of the dispensing system, eliminating the need for wiring harnesses to be routed between these components. Accordingly, the main board and power modules may be readily removed and replaced in the field to permit efficient servicing and modification of the system to accommodate the needs of various applications.

14 Claims, 4 Drawing Sheets

MODULAR CONTROLLER FOR A HOT MELT ADHESIVE DISPENSING SYSTEM

FIELD OF THE INVENTION

The present invention pertains to dispensing systems for dispensing flowable material, and more particularly to hot melt adhesive dispensing systems.

BACKGROUND OF THE INVENTION

Thermoplastic adhesives, otherwise known as "hot melt" adhesives, have been widely used in industry for adhering many types of products. Hot melt adhesive dispensing systems generally include one or more adhesive dispensing guns, heated hoses connected to the guns, and a dispensing unit for melting and supplying liquid adhesive to the guns through the heated hoses. The dispensing units of conventional hot melt adhesive systems can include a tank and heater, a pump, a manifold, and a controller. The manifold has an inlet connected to the tank and has multiple outlet ports for fluid connection to the heated hoses. Adhesive material is supplied to the tank in solid or semi-solid form, where it is melted and heated by the heater. A pump associated with the tank and manifold pumps liquid adhesive from the tank, through the manifold and heated hoses to the dispensing guns. The controller is generally located adjacent the tank and controls the power supplied to the heater and heated hoses to maintain the liquid adhesive at an appropriate viscosity and temperature according to the desired application.

The controller generally includes a main board which performs the power distribution functions of the dispensing system. In addition to the main board, the controller will generally include a CPU board and one or more power modules which are coupled with the main board and with the heated hoses. The controller is typically configured to be used with a predetermined number of guns and hoses (for example 2, 4, or 6 hoses). Users of adhesive dispensing systems often desire to upgrade the systems from, for example, two hose systems to four hose systems, or from four hose systems to six hose systems. However, the configuration of conventional controllers makes upgrading or other modification of the controller costly and very labor intensive. For example, the main board and power modules are typically housed in an enclosure and are coupled together by individual wiring harnesses. The power modules are in turn coupled to cord sets of the hoses using additional wiring harnesses. Accordingly, upgrading a conventional controller involves accessing the main board and power modules, uncoupling the associated wiring harnesses, removing the main board and power modules, installing a new main board and new power modules, and routing and connecting the new wiring harnesses. Furthermore, with some systems upgrading is not even possible.

In some applications, it may be desired to provide improved resistance to liquid infiltration into the controller. Such infiltration may occur, for example, by accidental spillage of liquid near the adhesive dispensing system, or by exposure to liquids during cleaning of the adhesive dispensing system or the immediate area surrounding the system. In these situations, it is desirable to prevent infiltration of liquids into the controller to prevent damage to electrical components contained therein.

The electrical components that make up the controller generate heat which must be dissipated to prevent overheating of the controller. Generally, heat sinks are added to conventional controllers to aid in the thermal management of the controller. However, fabricating or purchasing separate heat sinks and installing them on the controller represent additional costs which could be reduced or eliminated if a more efficient means of dissipating heat could be utilized.

There is thus a need for an improved controller which can be used with hot melt adhesive dispensing systems and which permits ready modification of the controller in the field for servicing or upgrading. There is also a need for a controller which provides improved resistance against liquid infiltration and simplifies the hardware required for thermal management.

SUMMARY OF THE INVENTION

The present invention provides a controller for use with a hot melt adhesive dispensing system that facilitates quick and easy removal and replacement of a main circuit board and power modules associated with the controller, whereby the controller may be readily serviced or reconfigured in the field. In this regard, the main board and power modules are removably received on an enclosure which houses the various components of the controller. In an exemplary embodiment, the main board and power modules are slidably received on the enclosure. The main board and power modules are provided with respective electrical sockets which permit the power modules to be coupled by plugging directly to the main board without the need for wiring harnesses which are used in conventional controllers. Accordingly, the power modules and main board may be coupled and uncoupled simply by sliding the components on the enclosure to engage or disengage one another. No routing and rerouting of wiring harnesses is required.

In another exemplary embodiment, the power modules are configured to be directly connected to cord sets associated with heated hoses of the adhesive dispensing system. This configuration eliminates the need for a connector plate and wiring harnesses between the cord sets and power modules, as is typical of conventional controllers, thereby further facilitating ready removal and replacement of power modules in the field.

In yet another exemplary embodiment, the power modules are mounted to side panels that have heat dissipating fins provided on an outer surface of the panels, whereby thermal management of the controller may be achieved without the need for additional heat sinks to be attached to the controller.

In another exemplary embodiment, the enclosure and the removable side panels to which the main board and power modules are mounted are configured to form tongue-and-groove joints at their interfaces, whereby the interior of the controller may be sealed against moisture infiltration.

These and other features and objectives of the present invention will become more readily apparent from the following Detailed Description taken in conjunction with the accompanying drawings.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

Figure 1:
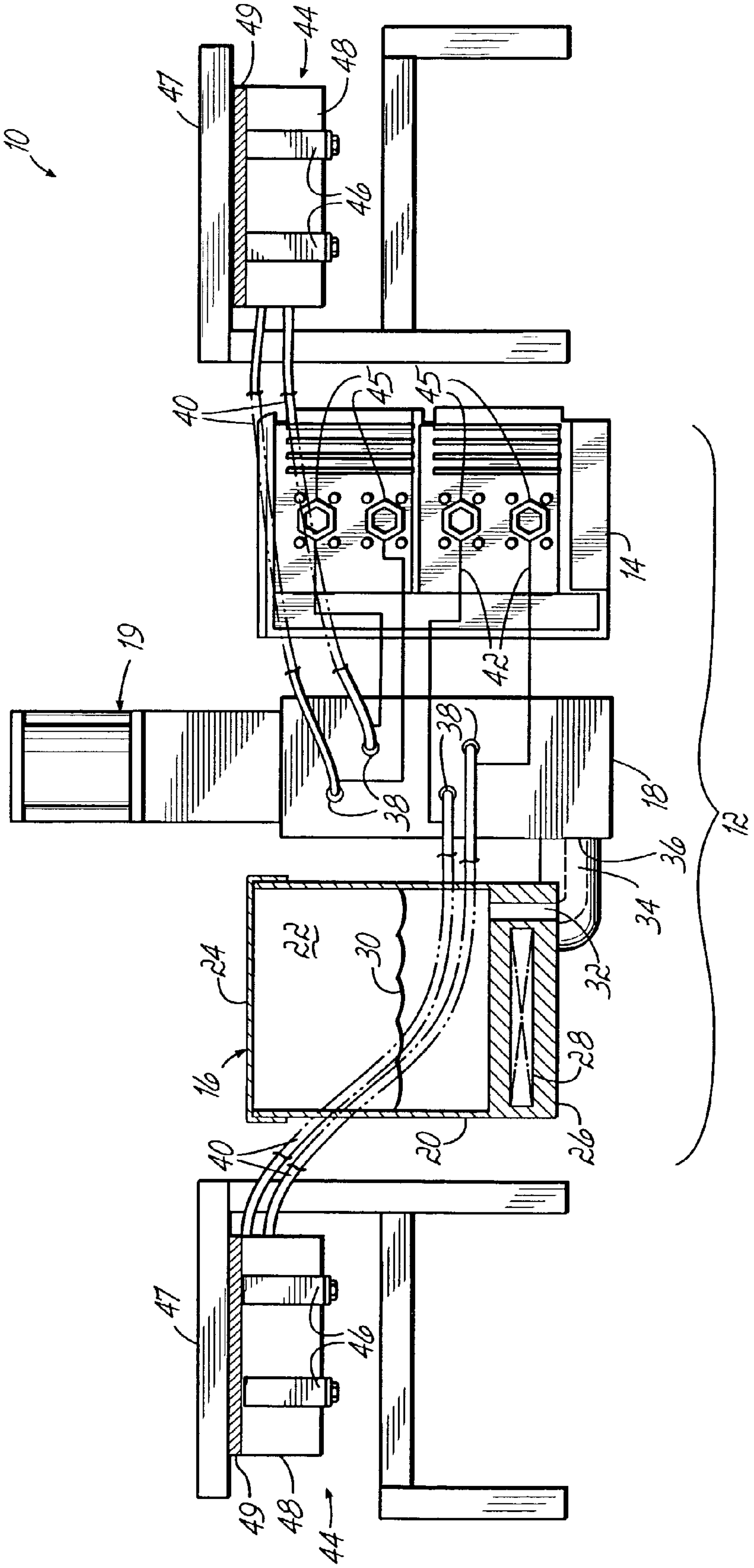
FIG. 1 is a schematic drawing of a hot melt adhesive system including an exemplary controller of the present invention.

Referring to FIG. 1, a hot melt adhesive system 10 is shown, including a dispensing unit 12 which incorporates an exemplary controller 14 according to the present invention. The dispensing unit 12 further includes a tank 16 for receiving and melting solid or semi-solid adhesive material, a manifold 18 connected to the tank 16, and a pump 19. The tank 16 comprises side walls 20 defining a tank interior 22, a removable cover 24, and a base 26 which includes a tank heater 28 for melting and heating the adhesive material 30 in the tank 16. A tank outlet 32 proximate the base 26 is coupled to a passage 34 which connects to an inlet 36 of the manifold 18. The pump 19 is coupled to the manifold 18 and pumps liquid adhesive 30 from the tank 16 and into the manifold 18 where it is split into separate flows. The manifold 18 has a plurality of outlet ports 38 which may be fitted with heated hoses 40 attached to one or more adhesive guns 44 to supply the liquid adhesive to the guns 44. The guns 44 include one or more adhesive dispensing modules 46 which apply the adhesive 30 to a desired product (not shown). The adhesive dispensing modules 46 are mounted to gun bodies 48 having gun heaters 49 and are supported on a frame 47. The hot melt adhesive system 10 shown in FIG. 1 includes two guns 44, one located on each side of the dispensing unit 12, although it will be understood that different numbers of guns 44 arranged in different configurations may be used for a given adhesive system as required.

With continued reference to FIG. 1, the controller 14 houses a power supply and electronic controls for the dispensing unit 12. The heated hoses 40 are electrically coupled to the controller 14 by cord sets 42 associated with each hose 40 and plugged into sockets 45 on the controller. The controller 14 independently monitors and adjusts the tank heater 28, the heated hoses 40, and the gun heaters 49 to melt solid adhesive received into the tank 16 and to maintain the temperature of the melted adhesive 30 to ensure proper viscosity of the adhesive 30 supplied to the guns 44 and dispensed by the adhesive dispensing modules 46.

Figure 2:
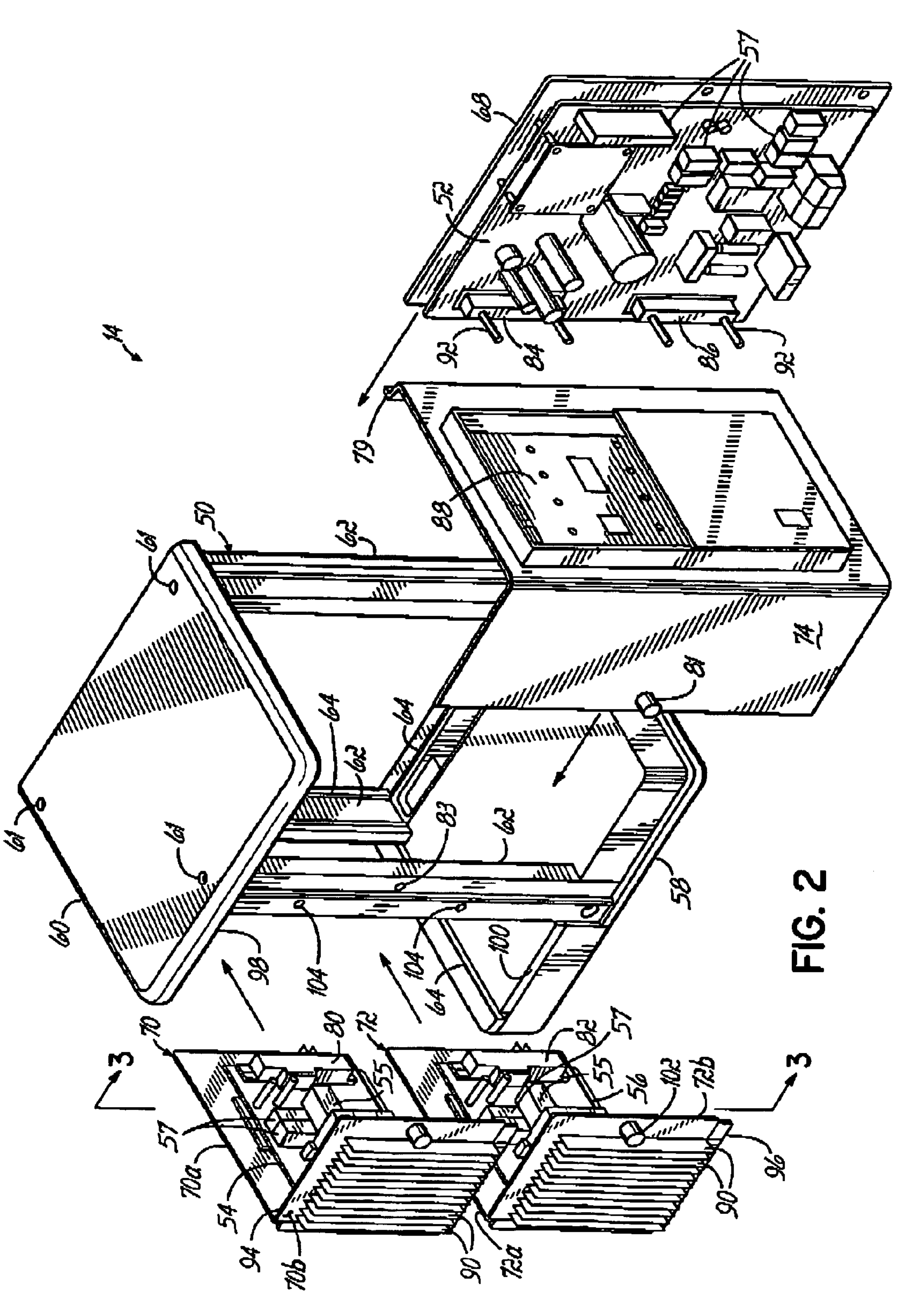
FIG. 2 is an exploded perspective view of an exemplary controller of the present invention.

Referring to FIG. 2 there is shown an exploded view of the exemplary controller 14 of FIG. 1. The controller 14 comprises an enclosure 50 which houses the various electronic components that control the operation of the dispenser 12, including a main board 52 and one or more power modules 54, 56 configured with conventional electronic devices 57 as is known in the art. The power modules 54, 56 further include individual power relays 55 which are configured to switch power only to those hoses 40 and guns 44 which plug into the respective modules 54, 56. These dedicated relays 55 eliminate the need for a large, central contactor which, in conventional systems, must be capable of switching power to all heaters of a dispensing system whether or not a given heater is actually present. Accordingly, the dedicated relays 55 may be compact in size and eliminate the additional cost associated with having a larger relay than is necessary for a given task.

The enclosure 50 further includes a base 58 and a top panel 60 connected to vertical frame members 62 by fasteners (not shown) received through apertures 61 in the top panel 60 and corresponding apertures (not shown) in the base 58. Advantageously, the main board 52 and the power modules 54, 56 are removably received onto the enclosure 50 whereby the main board 52 and/or modules 54, 56 may be easily removed and replaced for convenient servicing and/or reconfiguration of the controller 14. In the exemplary embodiment shown, the base 58, top panel 60, and vertical frame members 62 of the controller enclosure 50 have grooves 64 formed along their side edges to serve as rails for slidably receiving side panels 68, 70, 72, which form the exterior sides of the enclosure 50 and to which the main board 52 and power modules 54, 56 are mounted. A front panel 74 is received on the enclosure 50, adjacent side panels 68, 70, 72, by a flanged edge 79 engageable with a vertical frame member 62 and secured by a fastener 81 engageable with aperture 83 on another frame member 62 to complete the exterior shell of the enclosure 50.

With reference to FIGS. 2 and 4–7, there are shown detailed views of the interfacing portions of the edges of the side panels 68, 70, and 72 with the grooves 64 formed into the base 58, top panel 60, and vertical frame members 62. As illustrated in the figures, the adjacent components form tongue-and-groove joints which, in an exemplary embodiment, seal the interior of the enclosure 50 against liquid infiltration which may occur, for example, by exposure to liquids during cleaning of the adhesive system 10 or due to an accidental spillage of liquid near the controller 14.

Figure 4:
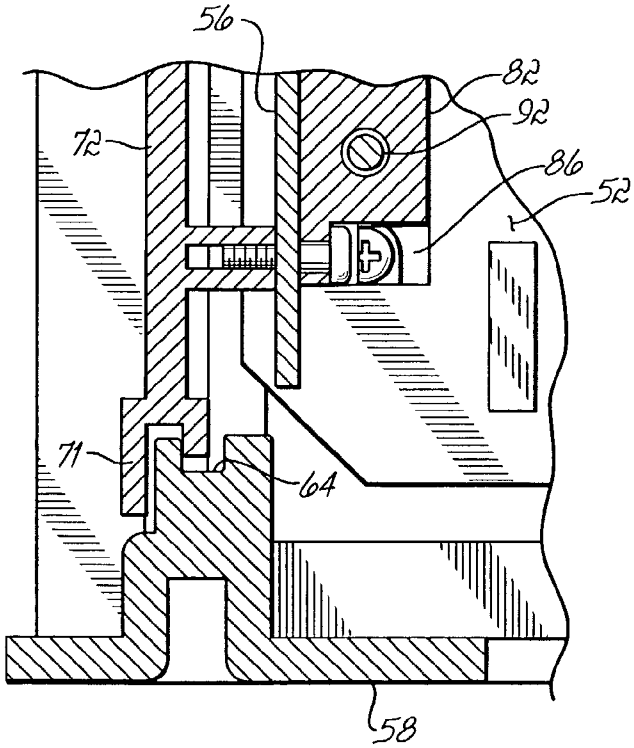
FIG. 4 is a partial section view of the controller of FIG. 3, taken along line 4—4 of FIG. 3.
Figure 5:
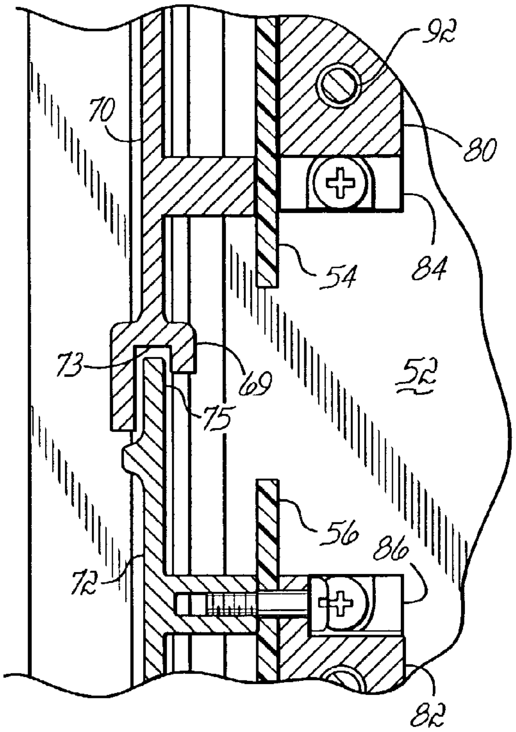
FIG. 5 is a partial section view of the controller of FIG. 3, taken along line 5—5 of FIG. 3.
Figure 6:
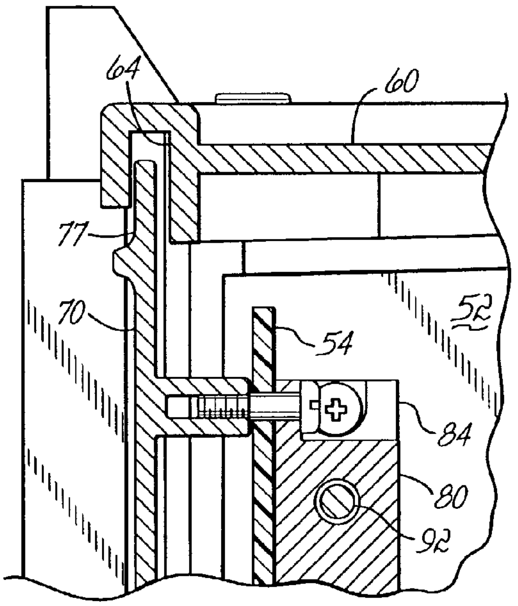
FIG. 6 is a partial section view of the controller of FIG. 3, taken along line 6—6 of FIG. 3.
Figure 7:
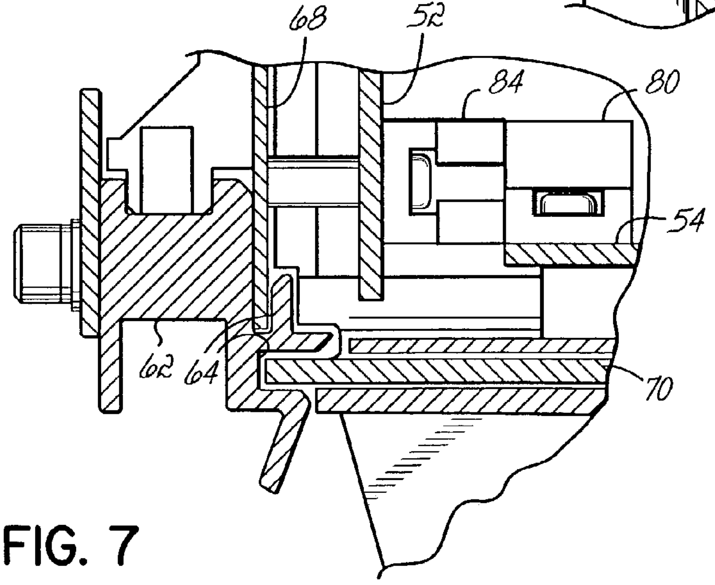
FIG. 7 is a partial section view of the controller of FIG. 3, taken along line 7—7 of FIG. 3.

FIG. 4 shows detail of the tongue-and-groove joint formed between a first section **72*a* of side panel 72 and base 58. As shown therein, a lower edge of first section 72*a* has a U-shaped section 71 which mates with groove 64 in the base 58. A similar U-shaped section 69 is provided at a lower edge of a first section 70*a* of side panel 70 and forms a groove 73 that receives a top edge 75 of first section 72*a* of panel 72, as shown in FIG. 5. Likewise, the top edge 77 of first section 70*a* of side panel 70 is received in groove 64 provided in the top panel 60, as shown in FIG. 6. The interfaces of side panel 68 and first section 70*a* of panel 70 with vertical frame member 62 is shown in FIG. 7, where side panels 68 and first section 70*a* are received in grooves 64 of vertical frame member 62**.

Referring to FIG. 2, second sections **70*b*, 72*b* of side panels 70 and 72, respectively, have respective top and bottom edges 94, 96 which abut corresponding ledges 98, 100 formed into the top panel 60 and base 58, respectively, to further seal the enclosure 50. Side panels 70, 72 are secured to vertical frame member 62 by fasteners 102 through apertures 104 in the vertical frame member 62**.

With continued reference to FIG. 2, the main board 52 and power modules 54, 56 are mounted to respective side panels 68, 70, 72, which may be received in the rails of the enclosure 50. In contrast to conventional controllers, the power modules 54, 56 of the present invention are configured to be directly coupled with the main board 52 by respective connectors 80, 82 on the power modules 54, 56 and connectors 84, 86 on the main board 52, as further illustrated in FIGS. 4–7. As shown in the figures, connector 80 on power module 54 couples with connector 84 on the main board 52, and connector 82 on power module 56 couples with connector 86 on the main board. To facilitate the coupling of connectors 80, 82, 84, 86, pins 92 are provided on connectors 84 and 86 on main board 52 to help guide connectors 80, 82 on the power modules 54, 56 into position. This direct coupling of components thereby eliminates the need for intermediate wiring harnesses to connect the power modules 54, 56 to the main board 52. The simplified design facilitates interchangeability of various power modules 54, 56 with the main board 52 for quick and easy replacement of the components as may be required for service or reconfiguration of the controller 14.

As illustrated in FIG. 2, the panel 68 supporting the main board 52 may be received between the base 58 and top panel 60 to form one side of the enclosure 50 while one or more panel sections 70, 72, to which the power modules 54, 56 are mounted, may be received between the base 58 and top panel 60 to form an adjacent side of the enclosure 50. The front panel 74 of the enclosure 50 supports a CPU (not shown) in a manner similar to that depicted for main board 52 on side panel 68. Front panel 74 further includes a control interface 88 configured to receive input from a user and to display information regarding the operation of the controller 14.

The power modules 54, 56 include various electronic components which generate heat. To facilitate the dissipation of heat from within the enclosure 50, the side panels 70, 72 to which the power modules 54, 56 are mounted are formed with several heat dissipating fins 90 disposed on the outer portions of the side panels 70, 72. Advantageously, this configuration eliminates the need for a separate heat sink to be added to the controller 14, as is typical of conventional designs.

Figure 3:
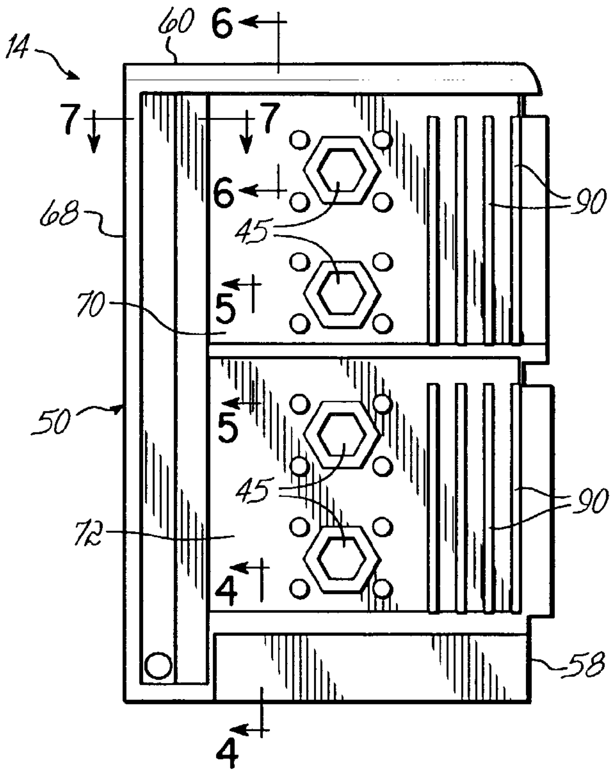
FIG. 3 is a side view of the controller of FIG. 2 taken along line 3—3 of FIG. 2 and depicting sockets for coupling with hose cord sets.

Referring now to FIG. 3, there is shown a side view of the controller 14 depicting side panels 70, 72, which support first and second power modules 54, 56 installed onto the enclosure 50. As shown in the figure, electrical sockets 45 are provided on side panels 70, 72 whereby the hose cord sets 42 may be coupled directly to the power modules 54, 56. This configuration eliminates the need for a connector plate and associated wire harnesses typically used in prior controllers to couple the hose cord sets 42 to the power modules. Because the sockets 45 are provided directly on the power modules 54, 56 and because the power modules 54, 56 are removable from the enclosure 50, the controller 14 may be easily reconfigured to accommodate various dispensing system arrangements having different numbers of heated hoses 40 supplying adhesive to dispensing guns 44.

While the present invention has been illustrated by the description of various embodiments thereof, and while the embodiments have been described in considerable detail, it is not intended to restrict or in any way limit the scope of the appended claims to such detail. Additional advantages and modifications will readily appear to those skilled in the art.

The invention in its broader aspects is therefore not limited to the specific details, representative apparatus and methods and illustrative examples shown and described. Accordingly, departures may be made from such details without departing from the scope or spirit of Applicant's general inventive concept.

What is claimed is:

1. A controller for a hot melt adhesive system having electrically heated hoses with associated hose cord sets, the controller comprising:

an enclosure comprising a frame and at least a first panel defining an interior configured to house various components of the controller;

a circuit board supported by said enclosure; and at least one power module carried by said first panel, said first panel removably received on said frame adjacent said circuit board whereby said power module is electrically coupled to said circuit board, said power module further couplable to a hose cord set to thereby control heating of an associated hose.

2. The controller of claim 1, wherein said power module includes a connector adapted for direct coupling with a hose cord set.

3. The controller of claim 1, wherein said first panel includes an exterior surface and a plurality of heat dissipating fins extending outwardly from said exterior surface.

4. The controller of claim 1, wherein said first panel includes at least one peripheral side edge configured to interface with said frame to thereby seal the controller from liquid infiltration when said first panel is installed on said frame.

5. The controller of claim 4, wherein said peripheral side edge interfaces with said frame by corresponding tongue-and-groove features to thereby seal said controller.

6. The controller of claim 1, wherein said enclosure comprises a second panel removably received on said frame, said circuit board carried by said second panel.

7. The controller of claim 1, wherein said power module further includes a power relay configured to switch power to hoses coupled to said power module.

8. A controller for a hot melt adhesive system having electrically heated hoses with associated hose cord sets, the controller comprising:

an enclosure comprising a frame and at least a first panel defining an interior configured to house various components of the controller;

a circuit board supported by said enclosure;

at least one power module carried by said first panel and directly coupled to said circuit board, said power module having a connector which extends outwardly of said first panel for direct coupling, with a hose cord set.

9. The controller of claim 8, wherein said first panel includes an exterior surface and a plurality of heat dissipating fins extending outwardly from said exterior surface.

10. The controller of claim 8, wherein said first panel includes at least one peripheral side edge configured to interface with said frame to thereby seal the controller from liquid infiltration when said power module is installed on said frame.

11. The controller of claim 10, wherein said peripheral side edge interfaces with said frame by corresponding tongue-and-groove features to thereby seal said controller.

12. The controller of claim 8, wherein said enclosure comprises a second panel removably received on said frame, said circuit board carried by said second panel.

13. The controller of claim 8, wherein said power module further includes a power relay configured to switch power to hoses coupled to said power module.

14. A dispensing unit for a hot melt adhesive system, the dispensing unit comprising:

a plurality of adhesive dispensing guns;

a plurality of electrically heated hoses having associated cord sets for heating said hoses, each hose operatively coupled to one of said guns for supplying adhesive to said guns;

a tank having a heater and an interior adapted to heat and melt adhesive material;

a controller couplable to said cord sets of said heated hoses to control the temperature of adhesive in said hoses, said controller including:

an enclosure comprising a frame and at least a first panel defining an interior configured to house various components of said controller, a circuit board supported by said enclosure, and at least one power module carried by said first panel, said first panel removably received on said frame adjacent said circuit board and electrically coupled to said circuit board and to said cord sets to thereby control heating of said hoses;

a manifold having an inlet and a plurality of outlets, said inlet in fluid communication with said tank interior and said plurality of outlets coupled to said plurality of adhesive guns by said heated hoses; and a pump coupled to said manifold to pump liquid adhesive from said tank, through said manifold and the heated hoses, to the adhesive guns.

* * * * *

UNITED STATES PATENT AND TRADEMARK OFFICE

CERTIFICATE OF CORRECTION

PATENT NO. : 6,977,817 B2
APPLICATION NO. : 10/252617
DATED : December 20, 2005
INVENTOR(S) : Daniel J. Suckow et al.

It is certified that error appears in the above-identified patent and that said Letters Patent is hereby corrected as shown below:

Column 6

Line 35, change “coupling,” to --coupling--.

Line 53, rewrite claim 14 as follows: --

14. A dispensing unit for a hot melt adhesive system, the dispensing unit comprising:

a plurality of adhesive dispensing guns;

a plurality of electrically heated hoses having associated cord sets for heating said hoses, each hose operatively coupled to one of said guns for supplying adhesive to said guns;

a tank having a heater and an interior adapted to heat and melt adhesive material;

a controller couplable to said cord sets of said heated hoses to control the temperature of adhesive in said hoses, said controller including:

an enclosure comprising a frame and at least a first panel defining an interior configured to house various components of said controller, a circuit board supported by said enclosure, and at least one power module carried by said first panel, said first panel removably received on said frame adjacent said circuit board and electrically coupled to said circuit board and to said-cord sets to thereby control heating of said hoses;

a manifold having an inlet and a plurality of outlets, said inlet in fluid communication with said tank interior and said plurality of outlets coupled to said plurality of adhesive guns by said heated hoses; and

UNITED STATES PATENT AND TRADEMARK OFFICE

CERTIFICATE OF CORRECTION

PATENT NO. : 6,977,817 B2
APPLICATION NO. : 10/252617
DATED : December 20, 2005
INVENTOR(S) : Daniel J. Suckow et al.

It is certified that error appears in the above-identified patent and that said Letters Patent is hereby corrected as shown below:

Line 53, rewrite claim 14 as follows: (cont'd)

a pump coupled to said manifold to pump liquid adhesive from said tank, through said manifold and the heated hoses, to the adhesive guns. --

Signed and Sealed this

Twenty-eighth Day of November, 2006

JON W. DUDAS

*Director of the United States Patent and Trademark Office*